United States Patent [19]

Giangano et al.

[11] Patent Number: 4,734,921
[45] Date of Patent: Mar. 29, 1988

[54] FULLY PROGRAMMABLE LINEAR FEEDBACK SHIFT REGISTER

[75] Inventors: David A. Giangano, Elmhurst; Cecelia Jankowski, East Norwich, both of N.Y.

[73] Assignee: Grumman Aerospace Corporation, Bethpage, N.Y.

[21] Appl. No.: 934,588

[22] Filed: Nov. 25, 1986

[51] Int. Cl.[4] .................. G11C 15/00; G11C 21/00; G11C 29/00
[52] U.S. Cl. ........................... 377/72; 377/49; 377/54; 377/129; 377/29; 377/110
[58] Field of Search ............. 377/72, 49, 54, 129, 377/29, 110

[56] References Cited

U.S. PATENT DOCUMENTS

| | | | |
|---|---|---|---|
| 3,278,727 | 10/1966 | Geis | 377/110 |
| 3,566,230 | 2/1971 | MacMullan | 377/110 |
| 3,691,472 | 9/1972 | Bohman | 377/72 |
| 3,742,381 | 6/1973 | Hurd | 377/72 |
| 3,818,354 | 6/1974 | Tomisawa et al. | 377/72 |
| 3,911,330 | 10/1975 | Fletcher et al. | 377/72 |
| 4,173,003 | 10/1979 | Thies | 377/49 |
| 4,223,268 | 9/1980 | Shimizu | 377/110 |
| 4,234,849 | 11/1980 | Crilly, Jr. | 377/110 |
| 4,264,864 | 4/1981 | Takeda | 377/110 |
| 4,296,380 | 10/1981 | Minakuchi | 377/110 |
| 4,331,926 | 5/1982 | Minakuchi | 377/110 |
| 4,334,194 | 6/1982 | Rittenbach | 377/110 |
| 4,366,393 | 12/1982 | Kasuya | 377/72 |
| 4,380,816 | 4/1983 | Nicholls | 377/72 |
| 4,438,350 | 3/1984 | Shepter | 377/67 |
| 4,536,881 | 8/1985 | Kasuya | 377/72 |

Primary Examiner—John S. Heyman
Attorney, Agent, or Firm—Pollock, Vande Sande & Priddy

[57] ABSTRACT

Basic block shift registers are cascaded to form a fully programmable linear feedback shift register. Each of the basic block shift registers comprises a plurality of flip-flops, each of which includes control logic circuits. A polynomial equation is first fed into the linear feedback shift register for setting the respective flip-flops into predetermined logic states, which are used to encode messages to be shifted by the programmable linear feedback shift register. The number of flip-flops in the programmable linear feedback shift register can be varied, in accordance to the polynomial equation. Likewise, the polynomial equation also determines the number of times the programmable linear feedback shift register is to circulate the encoded messages.

13 Claims, 5 Drawing Figures

FULLY PROGRAMMABLE LINEAR FEEDBACK SHIFT REGISTER

FIELD OF THE INVENTION

The present invention relates to shift registers and more particularly to a fully programmable linear feedback shift register.

BRIEF DESCRIPTION OF THE PRIOR ART

Linear feedback shift registers which use a number of flip-flops for circulating information by means of a sequence of bits are known. It is further known that such shift registers may be used for error coding and pseudo-random number generation. However, for each of these applications, a differently configured shift register needs to be used. Further, the hardware for the shift registers can get to be quite extensive, where repeatability is desired for a great number of times.

BRIEF DESCRIPTION OF THE PRESENT INVENTION

The present invention achieves a successful resolution of the aforesaid problems by presenting a linear feedback shift register which is fully programmable, thereby eliminating the need to have a particular configured shift register for a specific function. The flip-flops and control logic circuits in the present invention shift register are configured in such a way that the register can be used, aside from the above-mentioned functions of a conventional linear feedback shift register, for encoding and encryption of information. To do this, the present invention shift register utilizes a plurality of flip-flop stages each with its own control logic circuits. Each flip-flop stage is identical; and consequently, the shift register can be programmed for different lengths, as the number of flip-flops need not remain static. The output of any one of the flip-flops can be fed, via a feedback circuit, to the beginning stage of the shift register, thereby providing a myriad of different length shift registers.

Therefore, it is an object of the present invention to provide a linear feedback shift register which is fully programmable.

It is a further object of the present invention to provide a shift register adaptable for different types of applications without having its components reconfigured.

It is yet another objective of the present invention to provide a shift register having a plurality of flip-flops, which can easily be added to or subtracted from the shift register.

The above-mentioned objects and advantages of the present invention will become more apparent and the invention itself will be best understood by reference to the following description of an embodiment of the invention taken in conjunction with the accompanying drawings, wherein:

DETAILED DESCRIPTION OF THE PRESENT INVENTION

Figure 1:
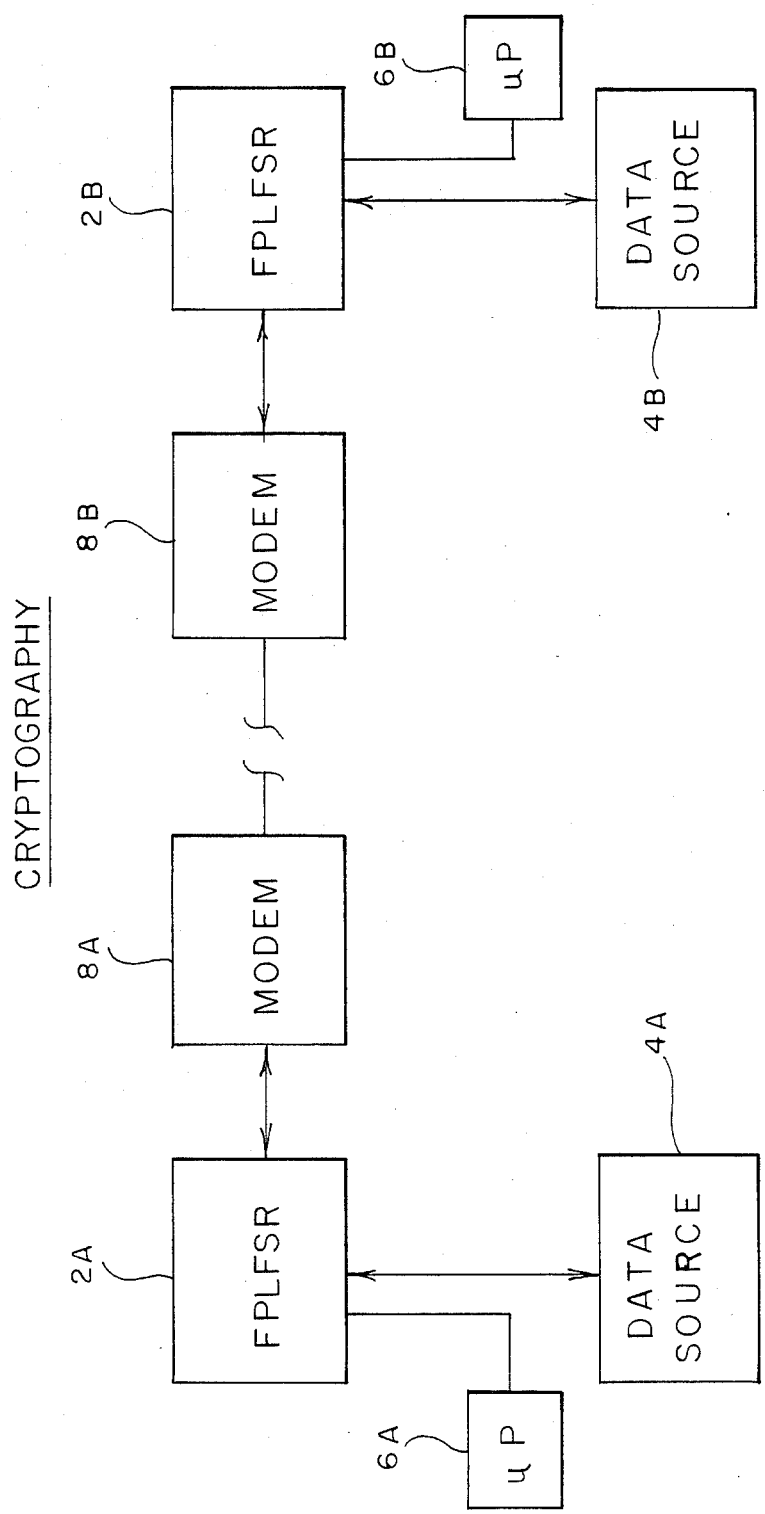
FIG. 1 is an illustration of how the present invention shift register can be used in an overall system.

Referring now to FIG. 1, there is shown a crypto-communication system wherein a present invention shift register is incorporated. In this system, a fully programmable linear feedback shift register 2A, hereinafter to be referred to as FPLFSR 2A, is connected to a data source 4A, a micro-processor 6A and a modem 8A. Data which is to be transmitted to a corresponding system is sent from data source 4A to FPLFSR 2A, wherein this data is encoded, before being sent to the corresponding system. It should be appreciated that the operation of FPLFSR 2A is controlled by microprocessor 6A. Upon receiving the encoded data, modem 8B transmits the encoded data to FPLFSR 2B, wherein the encoded data is unscrambled. It should be noted that both sets of transmitting and receiving components are identical and that the equations used for scrambling and unscrambling the data are the same.

Figure 2A:
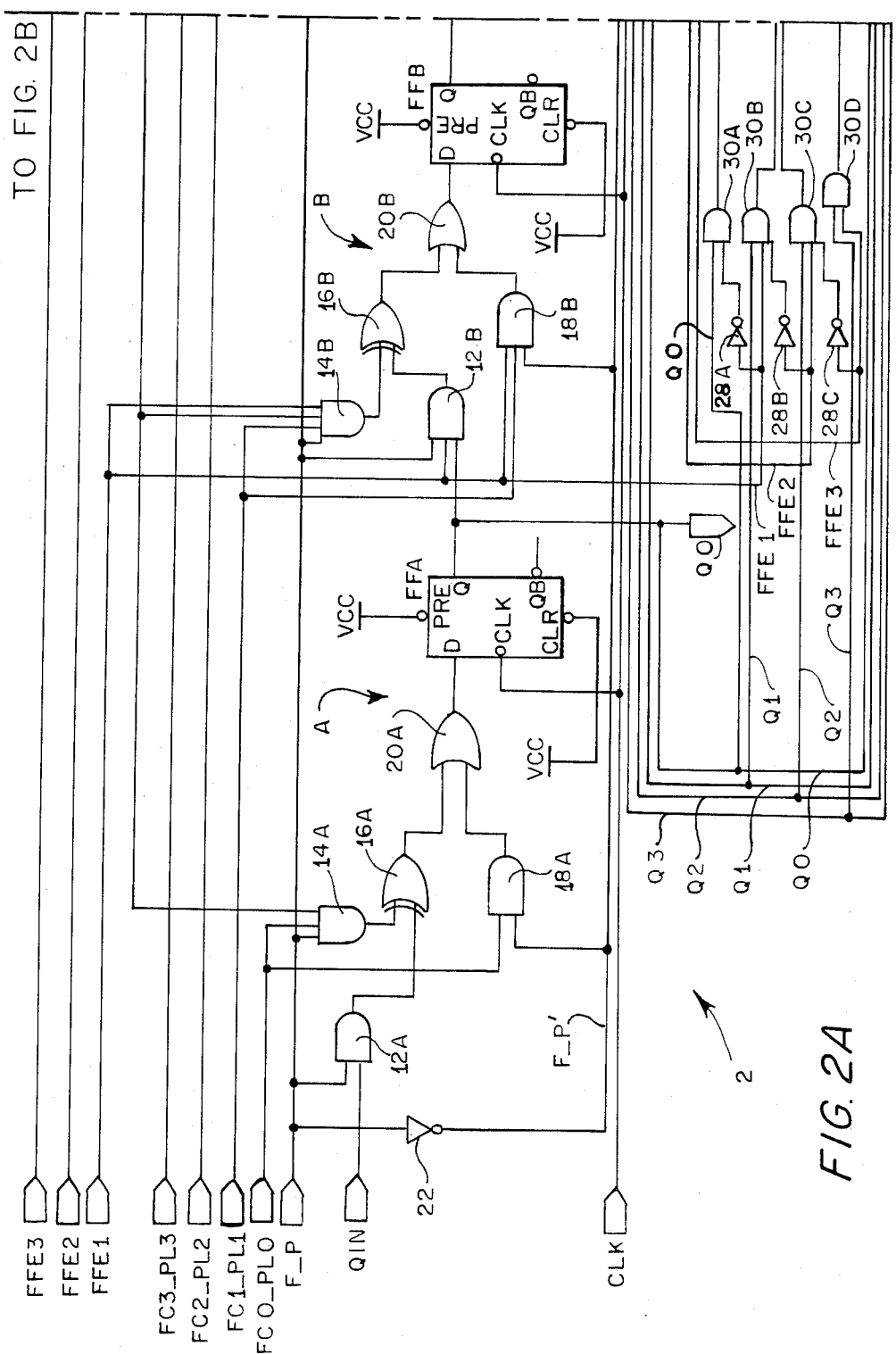
FIG. 2 (including 2A and 2B) is a schematic representing the detailed digital realization of the present invention shift register.
Figure 2B:
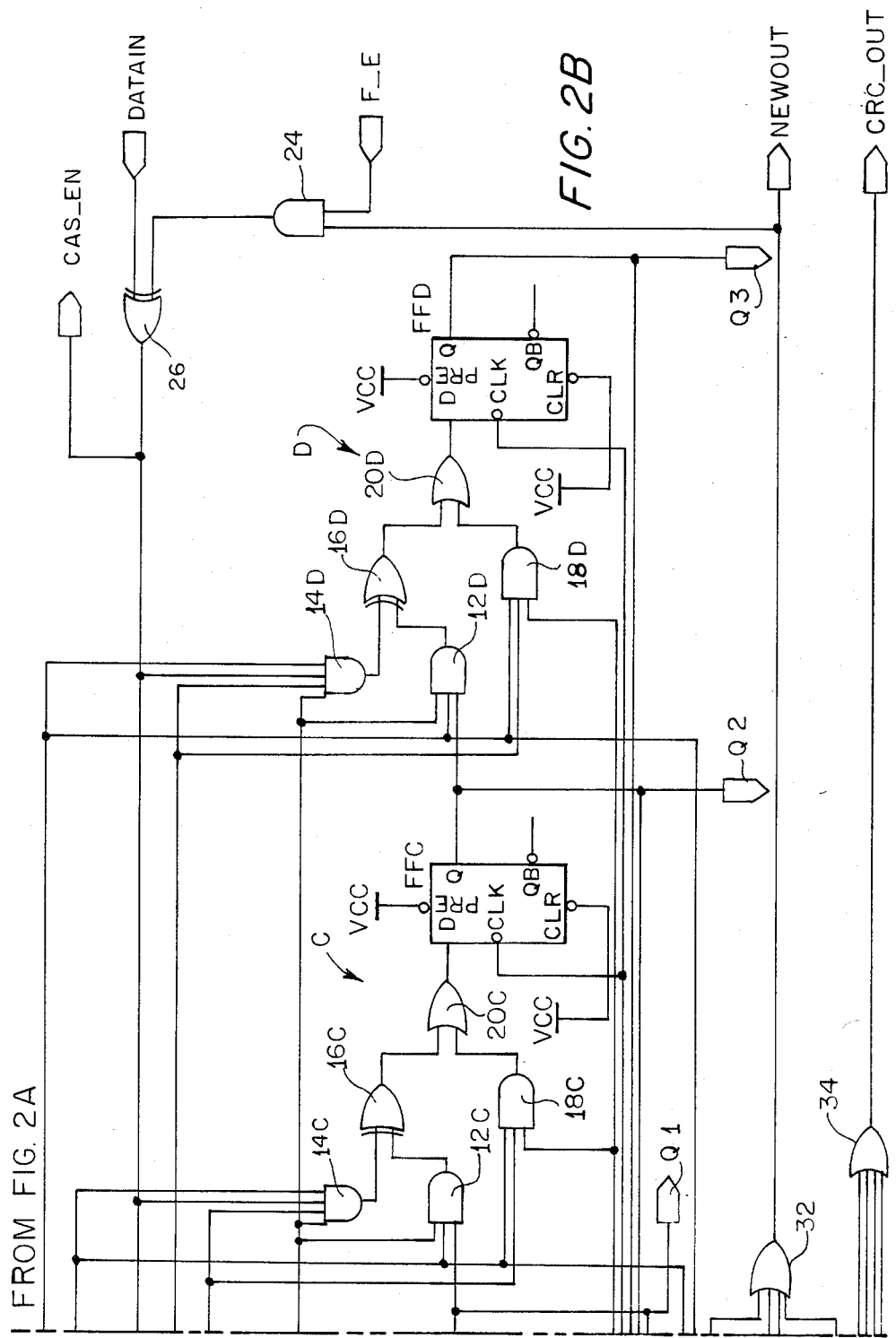

Having described a possible application of the present invention, attention is directed to FIG. 2, wherein a schematic drawing of the present invention shift register is shown. It must be emphasized that although 4 flip-flops are shown, the shift register is not limited to such a number, for an indefinite number of flip-flops and/or a multiple number of basic block shift registers can be cascaded to form shift registers having different numbers of flip-flops. As shown, FPLFSR 2 has four identical flip-flops FFA, FFB, FFC, and FFD. These flip-flops, for this example, are shown to be D-type flip-flops. Each of the flip-flops is associated to a number of logic gates, which are also identical. For example, in stage B, associated with flip-flop FFB are three AND gates 12B, 18B and 14B, exclusive OR gate 16B and an OR gate 20B. Except for the first stage, that is, stage A, all of the logic gates in remaining stages B, C and D are similarly connected to their respective flip-flops. Thus, it is sufficient that only one of these stages is discussed.

Focusing on stage B, it is seen that the outputs of AND gates 12B and 14B are connected as inputs of exclusive OR gate 16B. The output of exclusive OR gate 16B and the output of the remaining AND gate 18B are input to OR gate 20B, the output of which is connected to input D of flip-flop FFB. AND gate 14B has four inputs. The first input comes from the F_P line (Feedback/Parallel Load Control line). This line primes flip-flops FFA to FFD of the FPLFSR for parallel loading from lines FCn_PLn—to be discussed below—when the logic state thereon is low; for normal operation, the logic state of F_P remains high. The second input going into AND gate 14B is from a FC1_PL1 line (Feedback Control/Parallel Load line). It should be noted that the FC1_PL1 line is but one of four similar lines, referred to hereinabove as the FCn_PLn lines. Data fed from these lines are to be used either for parallel loading of a polynomial equation or for feedback control of the flip-flops.

A third input into AND gate 14B comes from the output of exclusive OR gate 26. The inputs and function of exclusive OR gate 26 will be described in greater detail, infra. The last input going into AND gate 14B comes from an FFE1 line (Flip-flop Enable line), which is but one of three identical lines. AND gate 12B, along with AND gates 12C and 12D, has three inputs. The first input for AND gate 12B comes from line F—P, which was described earlier. A second input comes from line FFE1. The last input comes from the output of flip-flop FFA of Stage A. AND gate 18B, like AND gates 18C and 18D, also has three inputs: the first input is fed from line FFE1; the second input is connected to line FC1—PL1; and the last input is connected to a line having a logic state opposite to that of line F—P.

The output of flip-flop B is fed to the input of AND gate 12C of flip-flop Stage C. Likewise, the output of flip-flop Stage C is sent to the input of AND gate 12D, thereby completing a series of cascaded flip-flop stages. Of course, the flip-flops are controlled by the timing pulses from the CLK line. Also, each of the flip-flops gets its power from VCC.

There are differences between the connections of the logic gates in flip-flop Stage A, when compared to the remaining flip-flop stages of the FIG. 2 embodiment. For example, for AND gate 12A, there are only two inputs. The first input is fed from line F—P while the second input is fed from line QIN, which is the serial data input for the first stage of the shift register; alternatively, the second input of AND gate 12A may be fed the cascaded output from the last flip-flop of a previous shift register. Another difference in flip-flop Stage A is that there are only two inputs to AND gate 18A. The first input is fed from line FC0—PL0 while the second input is fed from line F—P', which has a logic state opposite to that of line F—P. As shown, the change of the logic state is due to the insertion of NOT gate 22 between line F—P and the inputs to respective AND gates 18A, 18B, 18C and 18D.

As was mentioned previously, the outputs of the respective flip-flop stages are cascaded from one stage to the next. Also, these outputs, i.e., Q0, Q1, Q2 and Q3, are respectively connected to AND gates 30A, 30B, 30C and 30D. For AND gate 30D, a second input is connected to line FFE3. The output of line FFE3 is converted into the opposite logic state by NOT gate 28C and fed as an input to AND gate 30C, which has an input fed from line FFE2. The logic state of line FFE2 is converted to an opposed sense by NOT gate 28B and fed to AND gate 30B, which also has as a third input line FFE1. The logic state of line FFE1 is inverted by NOT gate 28A and fed as an input to AND gate 30A. Each of the outputs of AND gates 30A to 30D is input to OR gate 32, which has as its output signal NEW-OUT. NEWOUT represents the output of the last flip-flop stage used in the shift register. The outputs of the respective flip-flops are also connected as inputs to OR gate 34, thereby generating therefrom a CRC—OUT output (Cyclic Redundancy Check Output). This output will be high when any of the flip-flop outputs is high in the basic shift register building block of FIG. 2.

Output NEWOUT is fed to an input of AND gate 24, which also has an input signal from a F—E line (Feedback Enable Line). The output from AND gate 24 is fed as an input to exclusive OR gate 26. An additional input to exclusive OR gate 26 is fed from line DATAIN. The output from exclusive OR gate 26 is fed simultaneously to the inputs of respective AND gates 14A, 14B, 14C and 14D. The same output is further routed to a CAS—EN line (Cascade Enable Line). The CAS—EN line may be used to cascade the FIG. 2 basic block shift register to an additional similar basic shift register block via the latter's DATAIN line.

In operation, to initiate the system, a polynomial equation has to be first input into the respective flip-flops. This equation determines the number of flip-flops to be used, as well as the number of cycles before an initial message will repeat. For example, were a polynomial equation of $x^{20}+x^3+1$ used, one would be able to ascertain from this equation that 20 flip-flops are to be used for the particular shift register. In the event that a basic building block shift register, for example, that shown in FIG. 2, is available, then five of these basic blocks would be cascaded together, per FIG. 4, so that there is a total of 20 flip-flops. In other words, the order of the polynomial equation signifies the number of flip-flops to be used in that particular programmable linear feedback shift register.

Too, the number of times which a message is to be circulated through the flip-flops of the shift register before it repeats, can be determined by subtracting one from base two to the power of the most significant digit. Hence, for the example just cited, a 20 flip-flop shift register would have to repeat the message $2^{20}-1$, i.e., 1,048,575, times.

Returning now to the same polynomial equation, it should be noted that $x^3$ represents the FC3—PL3 line in FIG. 2. Of course, the least significant digit 1 of the polynomial equation actually represents the coefficient of $x^0$. Therefore, for this particular polynomial equation, there are 20 flip-flop stages, with the logic state of lines FC3—PL3 and FC0—PL0 being high. Any messages—represented by 0's and 1's—which are to be shifted by the shift register, will be encoded by this polynomial equation; and the encoded message will repeat after $2^{20}-1$ cycles.

To input the polynomial equation into the different flip-flop stages, line F—P is set to a high state. At this time, the data in the FCn—PLn lines are fed in parallel to the respective flip-flops. If there are more flip-flop stages available than is needed for a particular shift register, the FFEn lines can be used to designate from which flip-flop stage the final output of a message will be taken. For instance, were only three flip-flop stages needed in the FIG. 2 basic block shift register, then line FFE3 would be set to the low state, i.e., 0, while lines FFE2 and FFE1 would be set to the high state, i.e., 1. By first setting the logic states of the respective FFE lines, the last flip-flop stage D is effectively eliminated from the basic block shift register. Accordingly, output Q2 from flip-flop FFC, which output is connected to an input of AND gate 30C, becomes the final output of the FIG. 2 basic block shift register. The Q2 output, along with outputs from Q1 and Q0, which are respectively connected to AND gates 30B and 30A, is gated by OR gate 32 and fed to the NEWOUT line. As was mentioned previously, the output from this NEWOUT line is to be used as a feedback signal and is routed to AND gate 24.

For normal feedback operation, after a polynomial equation has been fed into the respective flip-flops, line F—P is kept in the high state. This means that no parallel loading would occur on each rise of a clock pulse, supplied by clock line CLK. During this normal operation, feedback occurs. The feedback is initiated by first setting the F—E line on a high logic state. When line F—E is high, the data stored in the flip-flops are advanced to the next stage and the feedback control data on the FCn—PLn lines are preloaded into the flip-flops of the shift register. Any input messages would be fed serially from line QIN to the first flip-flop stage, Stage A for this example. If there is shifting, and if line F_E and output from line NEWOUT are both set high, the output from the last flip-flop stage is exclusively ORed with the feedback control data from the FCn_PLn lines before being fed into the first stage (Stage A) of the shift register. Therefore, whatever polynomial equation is on the FCn_PLn lines gets shifted back into the shift register. This shifting will continue until the required number of times for circulating the message is satisfied.

In an effort to make sure that the flip-flops in a particular basic block shift register are operating correctly, the outputs of these flip-flops, i.e., Q0 to Q3, are gated to OR gate 34 which output, when registering a high logic, signifies that at least one of the flip-flops is in a high logic state. This signal is for error checking and can easily be measured, for instance, by attaching an oscilloscope to the CRC_OUT line.

Figure 3A:
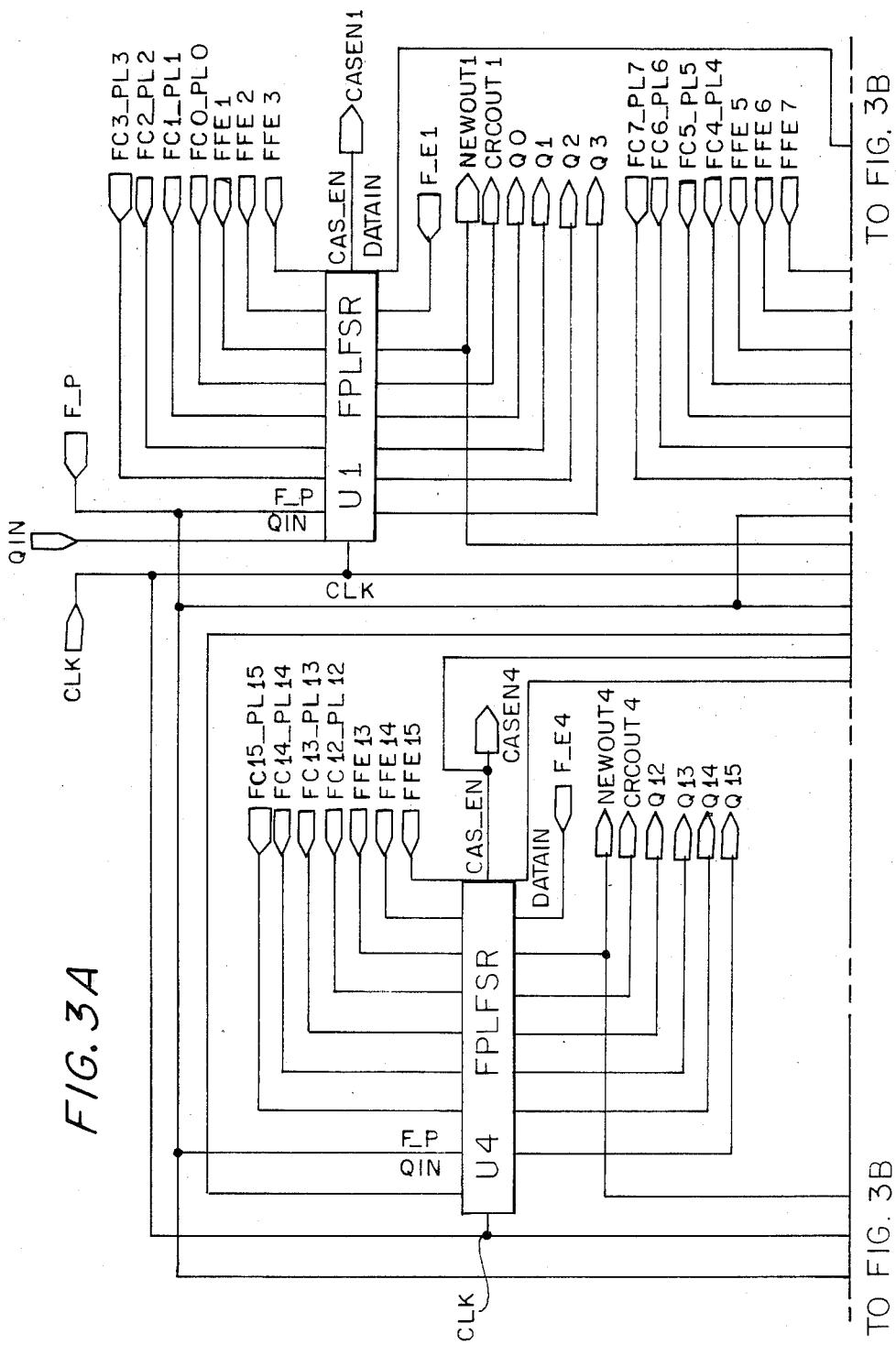
FIG. 3 (including 3A and 3B) is a schematic diagram showing the cascading of a number of FIG. 2 shift registers.
Figure 3B:
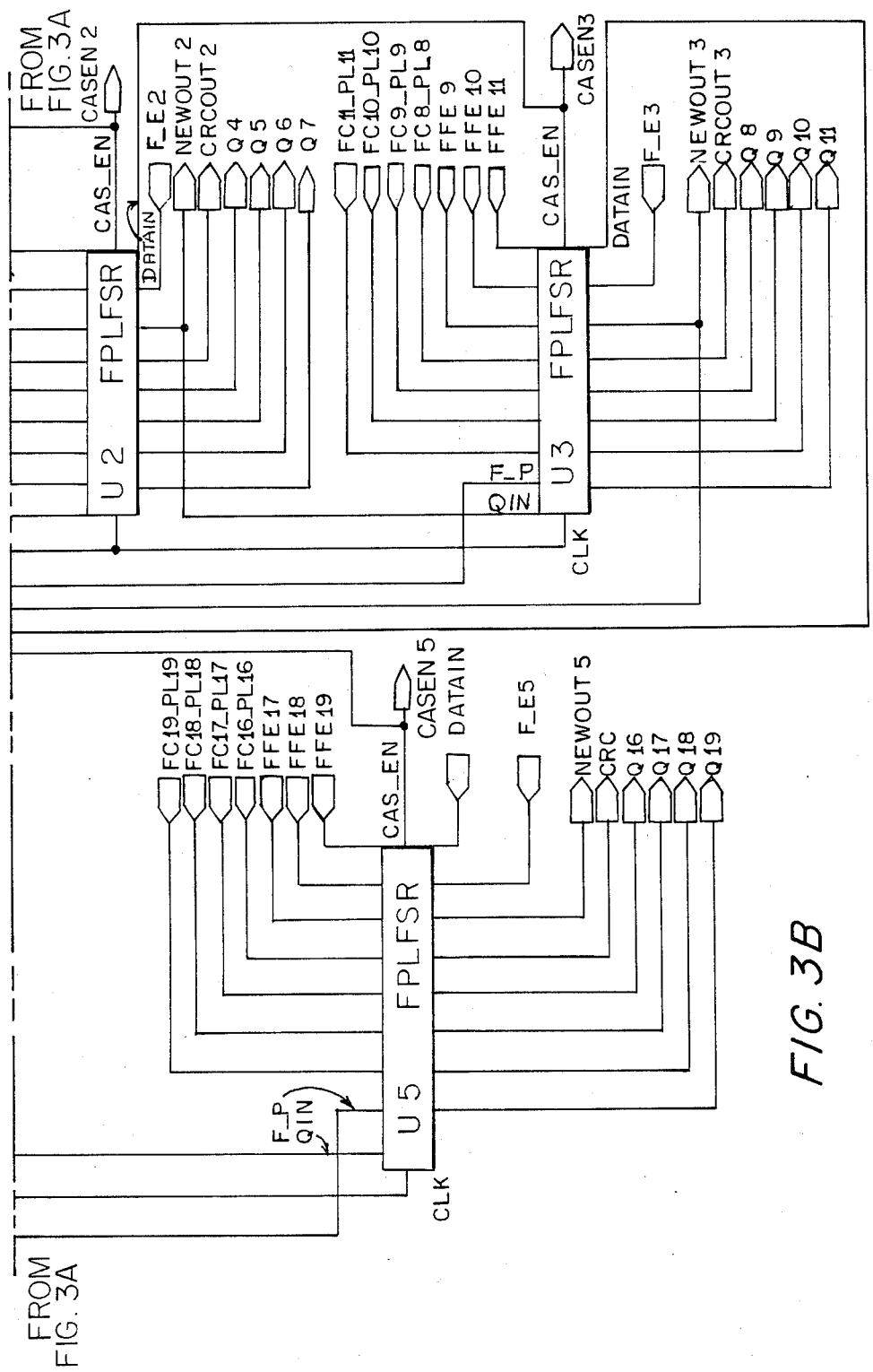

As was mentioned previously, the basic block shift registers can be cascaded into a shift register having multiple flip-flops. Such is shown in FIGS. 3A and 3B wherein five basic block shift registers, each containing four flip-flop stages, are cascaded to form a 20 flip-flop stage fully programmable linear feedback shift register.

While a preferred embodiment of the invention is disclosed for purposes of explanation, numerous changes, modifications, variations, substitutions, and equivalents, in whole or in part, will now be apparent to those skilled in the art to which the invention pertains. Accordingly, it is intended that the invention be limited only by the spirit and scope of the appended claims.

```
FORCE   FFE9        1 0
FORCE   FFE10       1 0
FORCE   FFE11       1 0
force   ffe13       1 0
force   ffe14       1 0
FORCE   FFE15       1 0
FORCE   FFE17       1 0
force   ffe18       1 0
force   ffe19       1 0
#FEEDBACK
FORCE   F_E1        0 0
force   f_e2        0 0
FORCE   F_E3        0 0
force   f_e4        0 0
FORCE   F_E5        1 0
#POLYNOMIAL PROGRAMMED TO FEEDBACK
CONTROL LINES HERE
FORCE   FC0_PL0     1 60
FORCE   FC1_PL1     0 60
FORCE   FC2_PL2     0 60
FORCE   FC3_PL3     1 60
force   fc4_pl4     0 60
force   fc5_pl5     0 60
force   fc6_pl6     0 60
force   fc7_pl7     0 60
FORCE   FC8_PL8     0 60
FORCE   FC9_PL9     0 60
FORCE   FC10_PL10   0 60
FORCE   FC11_PL11   0 60
force   fc12_pl12   0 60
force   fc13_pl13   0 60
force   fc14_pl14   0 60
force   fc15_pl15   0 60
TRANSCRIPT ON
CLOCK PERIOD 100
FORCE CLK 0 0 -R
FORCE CLK 1 50 -R
#INTIALIZATION
FORCE   DATAIN      0 0
FORCE   QIN         0 0
FORCE   F_P         0 0
FORCE   F_P         1 60
#RANDOM NUMBER INPUTTED
FORCE   FC0_PL0     1 0
FORCE   FC1_PL1     1 0
```

-continued
```
FORCE   FC2_PL2     1 0
FORCE   FC3_PL3     1 0
force   fc4_pl4     1 0
force   fc5_pl5     1 0
force   fc6_pl6     1 0
force   fc7_pl7     1 0
FORCE   FC8_PL8     1 0
FORCE   FC9_PL9     1 0
FORCE   FC10_PL10   1 0
FORCE   FC11_PL11   1 0
force   fc12_pl12   1 0
force   fc13_pl13   1 0
force   fc14_pl14   1 0
force   fc15_pl15   1 0
FORCE   FC16_PL16   1 0
FORCE   FC17_PL17   1 0
FORCE   FC18_PL18   1 0
FORCE   FC19_PL19   1 0
#FLIP FLOPS ENABLED HERE
FORCE   FFE1        1 0
FORCE   FFE2        1 0
FORCE   FFE3        1 0
force   ffe5        1 0
force   ffe6        1 0
force   ffe7        1 0
```

We claim:

1. A fully programmable linear feedback shift register, comprising:
a plurality of cascaded flip-flops;
first means working cooperatively with the flip-flops for selecting a number of the flip-flops;
second means connected to the outputs of the flip-flops and the first means for receiving data from the last of the selected flip-flops;
first input means electrically connected to the flip-flops and a load control means for, upon a first command from the load control means, feeding a first set of data in parallel to the selected flip-flops, thereby establishing in the selected flip-flops a set of predetermined data, wherein the load control means, when not commanding the input means to feed the first set of data in parallel to the flip-flops, initiates a second command for inputting from a second input means a second set of data serially to the selected flip-flops;
third means connected to the second means and working cooperatively with the load control means and the first input means for routing the data from the last of the selected flip-flops to the first of the selected flip-flops, thereby causing the data in the respective selected flip-flops to advance to succeeding selected flip-flops;
whereby the second set of data is encoded by the set of predetermined data and wherein the encoded data are circulated through the selected flip-flops.

2. A fully programmable linear feedback shift register according to claim 1, wherein the predetermined data includes data for presetting the number of times the encoded data are to circulate through the selected flip-flops.

3. A fully programmable linear feedback shift register according to claim 2, wherein the first means comprises a plurality of data lines having logic states thereof controlled by an external controlling means.

4. A fully programmable linear feedback shift register according to claim 2, wherein each flip-flop has at its input a plurality of logic circuits and wherein these circuits include AND, exclusive OR and OR gates.

5. A fully programmable linear feedback shift register according to claim 2, wherein the second means includes a plurality of AND gates having outputs thereof connected to an OR gate, the inputs of the AND gates being cascaded by a plurality of NOT gates.

6. A fully programmable linear feedback shift register according to claim 2, wherein the flip-flops are of the D type.

7. A fully programmable linear feedback shift register according to claim 2, wherein the third means includes an alternate feedback control input, an AND gate and an exclusive OR gate and wherein the third means is initiated by combining the data output from the second means and a feedback enable signal from the alternate feedback control input.

8. A fully programmable linear feedback shift register according to claim 2, further comprising: a redundancy check output for determining whether any of the flip-flops is in a high logic state.

9. Apparatus for generating and decoding digital data, the apparatus having a plurality of shift registers in cascade, the shift registers being variable in length, each of the shift registers comprising:
a plurality of cascaded flip-flops;
a plurality of data lines, corresponding to the number of flip-flops, each electrically connected to a particular flip-flop;
a plurality of enable lines each connected to a corresponding one of the flip-flops, a high logic state in an enable line signifying the selection of the corresponding flip-flop as a stage of the shift register;
a load control means working cooperatively with the data lines and the selected flip-flops for initiating the feeding in parallel of a set of predetermined data from the data lines to the selected flip-flops, thereby establishing in the selected flip-flops predetermined data; the load control means, when not working cooperatively with the data lines for feeding in parallel a set of predetermined data to the flip-flops, initiates the inputting of a set of data serially to the selected flip-flops from a serial data input, the set of serial data being encoded by the set of previously stored predetermined data;
a plurality of identical logic circuits each electrically connected to an output of a corresponding flip-flop, one of the logic circuits receiving data from the last of the selected flip-flops, the logic circuits having one common output;
a feedback circuit having an input connected to the output of the logic circuits and an output electrically connected to the inputs of the respective flip-flops, the feedback circuit working cooperatively with the data lines for routing the data from the last of the selected flip-flops to the first of the selected flip-flops, thereby causing the data in the respective selected flip-flops to advance to succeeding flip-flops;
whereby the set of encoded data is circulated through the selected flip-flops.

10. Apparatus according to claim 9, wherein the predetermined data includes data for presetting the number of times the set of encoded data is to circulate through the selected flip-flops.

11. Apparatus according to claim 9, further comprising: a redundancy check output for determining whether any of the flip-flops has a high logic output.

12. Apparatus according to claim 9, wherein each logic circuit comprises an AND gate.

13. Apparatus according to claim 9, wherein the feedback circuit comprises an AND gate having its output connected to a first input of an exclusive OR gate and an alternate feedback control signal being fed to a second input of the exclusive OR gate.

* * * * *

UNITED STATES PATENT AND TRADEMARK OFFICE
CERTIFICATE OF CORRECTION

PATENT NO. : 4,734,921
DATED : March 29, 1988
INVENTOR(S) : David A. Giangano, et al.

It is certified that error appears in the above-identified patent and that said Letters Patent is hereby corrected as shown below:

ON THE TITLE PAGE:
In Section [75] listing the inventors, after "Cecelia Jankowski, East Norwich," add --Eric Josefson, Lindenhurst, N.Y.--.

Column 5, line 63, change "#INTIALIZATION" to --#INITIALIZATION--.

Column 5, line 32 ("FORCE FFE9   1 0") through line 58 ("force fc15_pl15   0   60") should appear after Column 6, line 23 ("force ffe7   1 0").

Signed and Sealed this

Thirteenth Day of September, 1988

Attest:

DONALD J. QUIGG

*Attesting Officer*     *Commissioner of Patents and Trademarks*